United States Patent [19]

Kang

[11] Patent Number: 5,566,116

[45] Date of Patent: Oct. 15, 1996

[54] BIT LINE SENSE AMPLIFIER OF SEMICONDUCTOR MEMORY DEVICE

[75] Inventor: Kyung-Woo Kang, Suwon, Rep. of Korea

[73] Assignee: Samsung Electronics Co., Ltd., Suwon, Rep. of Korea

[21] Appl. No.: 492,578

[22] Filed: Jun. 20, 1995

[30] Foreign Application Priority Data

Jun. 21, 1994 [KR] Rep. of Korea .................. 14018/1994

[51] Int. Cl.$^6$ .................................................. G11C 7/00
[52] U.S. Cl. ...................... 365/205; 365/207; 365/149; 365/203
[58] Field of Search ..................... 365/205, 207, 365/203, 230.03, 149, 208; 327/51, 57

[56] References Cited

U.S. PATENT DOCUMENTS 4,980,863  12/1990  Ogihara .................................. 365/205
5,412,605   5/1995  Ooishi ................................... 365/203
5,444,662   8/1995  Tanaka et al. ......................... 365/207

*Primary Examiner*—David C. Nelms
*Assistant Examiner*—Huan Hoang
*Attorney, Agent, or Firm*—Cushman Darby & Cushman, L.L.P.

[57] ABSTRACT

A bit line sense amplifier in a semiconductor memory device having a sense amplifier for sensing and amplifying a logic slate of data stored in a selected memory cell in response to a row address and for outputting sense-amplified data to a bit line pair, and transmission means for transmitting output data of the bit line pair to the corresponding input/output line pair thereto. The bit line sense amplifier includes a secondary power supply voltage generating circuit for supplying a secondary power supply voltage and a secondary ground potential in response to a block selection signal for selecting a memory block including the selected memory cell, and a secondary sense amplifier being supplied with the secondary power supply voltage and secondary ground potential, and for converting data indicative of a potential difference of the bit line pair and input/output line pair to a level of the secondary power supply voltage and ground potential in response to the column selection signal.

12 Claims, 5 Drawing Sheets

BIT LINE SENSE AMPLIFIER OF SEMICONDUCTOR MEMORY DEVICE

BACKGROUND OF THE INVENTION

1. Field of the Invention

The present invention relates to semiconductor memory devices, and more particularly, to an improved bit line sense amplifier for reading data stored in memory cells of the semiconductor memory device at a high speed.

2. Description of the Related Art

In a semiconductor memory device, particularly, a dynamic random access memory, data stored in the memory cell, which is selected by a row decoder, is charged or discharged to he bit line connected to a drain of a cell transistor. Information indicated by a voltage difference on the bit line is then sensed and amplified by a sense amplifier connected parallel with the bit line and the sense-amplified Information is outputted to exterior input/output devices. Further, dynamic memory function can be executed as an initial data is restored in the read-out memory cell.

However, the higher the integration density of the memory device and the higher its operational speed thereof is, the smaller its capacitance becomes. This increases of a load by the capacitance of the bit line. Hence, disadvantages arise in that the time required for sensing and amplifying a slight potential difference on the bit line is lengthened, and a data reading speed of the semiconductor memory device is accordingly delayed.

FIG. 1 is a circuit diagram illustrating a configuration of a conventional bit line sense amplifier, which is composed of memory cells MC1 and MC2 respectively connected to word lines WL1 and WL2 and controlled thereby, a sense amplifier 100 shared by the memory cells MC1 and MC2, for sensing and amplifying data stored therein, and Isolation circuits 200 and 300 respectively coupled between each of memory cells MC1 and MC2 and the sense amplifier 100, for electrically connecting or separating the sense amplifier 100 to/from each of memory cells MC1 and MC2 in response to separating control signals ISO1 and ISO2. The sense amplifier 100 includes a p-type sense amplifier 110 driven by a sense amplifier driving signal LA and composed of two PMOS transistors P1 and P2, and an n-type sense amplifier 120 driven by an inverse sense amplifier driving signal $\overline{LA}$ and composed of two NMOS transistors N1 and N2, thereby sensing and amplifying a potential difference on a bit line pair BL and $\overline{BL}$. The bit line pair BL and $\overline{BL}$ is under the control of a column selection signal CSL, and is electrically separated or connected from/to an input/output line pair IO and $\overline{IO}$ through a transmission circuit 400 composed of two NMOS transistors 410 and 420.

FIG. 2 is a timing diagram illustrating a data reading operation of the bit line sense amplifier of FIG. 1, by which an operation of the conventional bit line sense amplifier will be given. For example, assuming that the word line WL1 is selected by a row address input, a first isolation gate control signal IS01 is enabled to a logic "high" state and a second isolation gate control signal IS02 is then disabled to a logic "low" state. Accordingly, data of the memory cell MC1 connected to the word line WL1 is loaded in the bit line pair BL and $\overline{BL}$ through channels of NMOS transistors 210 and 220 as components in the isolation circuit 200. And then, a potential precharged to a prescribed level in the bit line pair BL and $\overline{BL}$ performs a charge-sharing with the potential of the memory cell MC1 during the period of time t1 of FIG. 2.

Thereafter, if the sense amplifier driving signals LA and $\overline{LA}$ are respectively enabled to the logic "high" and "low" states, the p-type sense amplifier 100 and n-type sense amplifier 120 are driven to sense and amplify the potential difference on the bit line pair BL and $\overline{BL}$ during the period of time t2 of FIG. 2. Then, if the column selection signal CSL is enabled to the logic "high" state after a given time duration has elapsed, each of the NMOS transistors 410 and 420, which constitutes the transmission circuit 400, is turned ON so that an amplified potential difference on the bit line pair BL and $\overline{BL}$ is transmitted to the input/output line pair IO and $\overline{IO}$. And then, a developing slope of the potential difference on the bit line pair during the period of time t2 depends on that of sense amplifier driving signals LA and $\overline{LA}$.

However, in order to facilitate circuit simplification and high-density memory, only one sense amplifier driving signal generator (not shown) is coupled to a plurality or bit line sense amplifiers to supply the sense amplifier driving signals LA and $\overline{LA}$. Therefore, load is significantly increased, thereby causing the developing slope of the sense amplifier driving signals LA and $\overline{LA}$ to be in a slow state, as shown in FIG. 2. As a result, the developing slope of the potential difference on the bit line pair BL and $\overline{BL}$ becomes slow, thus reducing a sensing speed. For these reasons, the column selection signal has to be enabled after the time required for developing the potential difference on the bit line pair and must be extended by a given time duration, so that data on the bit line pair BL and $\overline{BL}$ can be exactly transmitted to the input/output lines pair IO and $\overline{IO}$ without error through the transmission circuit 400 Generally, the length of the input/output lines pair IO and $\overline{IO}$ is mush grater than that of the bit line pair BL and $\overline{BL}$. Therefore, their parasitic capacitance is ten times as large as that of the bit line. The input/output lines pair IO and $\overline{IO}$ is precharged to a given level before the column selection signals is enabled to the logic "high" slate, but herein, it is assumed that the input/output lines pair IO and $\overline{IO}$ is precharged to Vcc-Vt level.

An operation that the bit line pair BL and $\overline{BL}$ performs a charge-sharing with the input/output lines pair IO and $\overline{IO}$ during the period of time t3 of FIG. 2, will be described hereinbelow. As shown in FIG. 2, when the column selection signal is enabled to the logic "high" state before the potential difference on the bit line pair BL and $\overline{BL}$ is fully developed, since the bit line pair BL and $\overline{BL}$ shares charge with the input/output line pair IO and $\overline{IO}$ having relative large parasitic capacitance, a potential difference $\Delta VbL$ on the bit line pair BL and $\overline{BL}$ is temporarily decreased by a given voltage. Accordingly, the developing speed of the potential difference on the input/output lines pair IO and $\overline{IO}$ is delayed by the period of time required for re-developing the reduced potential difference.

On the other hand, since the input/output line pair has a large parasitic capacitance and the developing slope of sense amplifier driving signals LA and $\overline{LA}$ is in a slow state, the developing slope of the input/output line pair is also in a slow state, as shown in the period of time t3 of FIG. 2, wich significantly delayed a data output operation. In particular, in the art of DRAM (Dynamic Random Access Memory), this acts as an impediment in reducing the time tRAC required for outputting effective data after receiving a row address strove signal $\overline{RAS}$. In other words, since the period of time t2 required for enabling the column selection signal CSL after fully developing the potential difference $\Delta VbL$ on the bit line pair, and the period of time t3 required for amplifying a potential difference $\Delta ViO$ through an input/output sense amplifier (not shown) after fully developing the potential difference ΔVio on the input/output line pair IO and $\overline{IO}$ are inevitably necessary, an overall data reading speed in a memory device is accordingly decreased. Further, since precharging of the input/output line pair is performed when an input of a non-effective column address is changed into an input of the effective column address, if an equalization of the input/output line pair IO and $\overline{IO}$ is incomplete, the development of the potential difference thereon is significantly delayed by the effective data on the bit line pair, and accordingly the data reading speed of the memory device is also delayed.

SUMMARY OF THE INVENTION

It is an object of the present invention to provide bit line sense amplifier of a semiconductor memory device which executes a data reading operation at a high speed by minimizing the time required for performing charge-sharing between bit line and input/output line.

This and other objects are accomplished by constructing a bit line sense amplifier according to the principles or the present invention. The bit line sense amplifier includes a sense amplifier which senses and amplifies a logic state of data stored a memory cell selected in response to a row address and outputs the amplified data to the bit line pair. A transmission circuit transmits the output data of the bit line pair to an input/output lie pair corresponding thereto in response to a column selection signal. A secondary power supply voltage generating circuit supplies a secondary power supply voltage and a secondary ground potential in response to a block selection signal for selecting a memory block having the selected memory cell. A p-type secondary sense amplifier receives the secondary power supply voltage and converts a potential of the bit line pair into a level of the secondary power supply voltage in response to the column selection signal. An n-type secondary sense amplifier receives the secondary ground potential and Converts a potential of the bit line pair into a level of the secondary ground potential in response to the column selection signal, thereby developing a potential difference of the bit line pair and the input/output line pair at a high speed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, and wherein.

DETAILED DESCRIPTION OF THE PREFERRED EMBODIMENT

Figure 1:
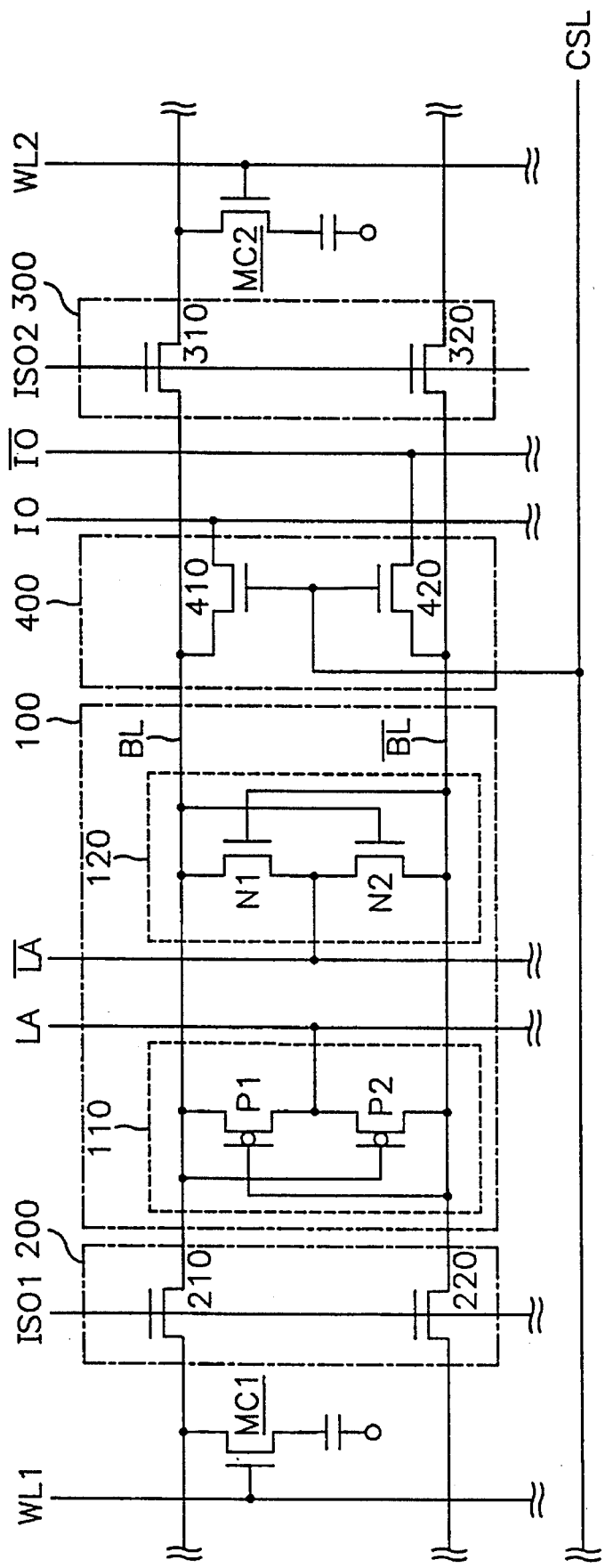
FIG. 1 is a circuit diagram illustrating a configuration of a conventional bit line sense amplifier.
Figure 3:
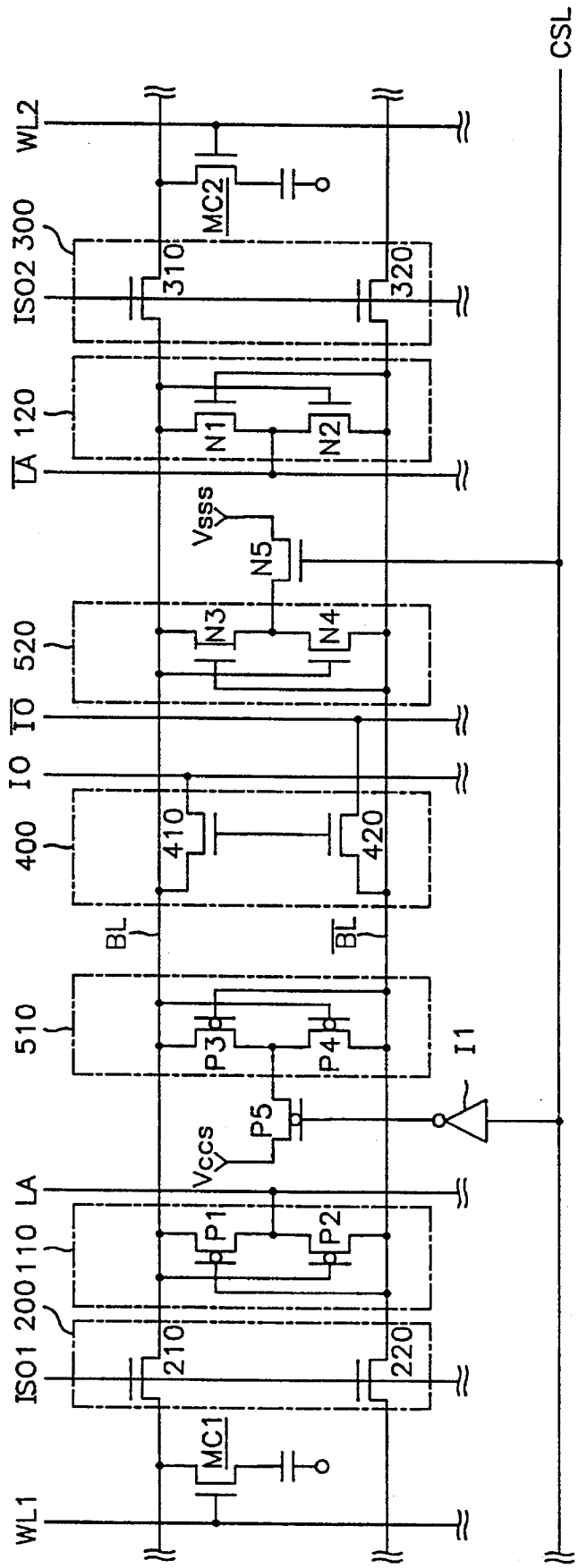
FIG. 3 is a circuit diagram illustrating a constitution of a bit line sense amplifier according to an embodiment of the present invention.

FIG. 3 is a circuit diagram illustrating a construction of a bit line sense amplifier according to an embodiment of the present invention. As shown in FIG. 3, the configurations of memory cells MC1 and MC2, a p-type sense amplifier 110, an n-type sense amplifier 120, isolation circuits 200 and 300 and a transmission circuit 400, and the connection relationship between these elements are equal to those of the conventional circuit of FIG. 1. However, a circuit according to the present invention shown in FIG. 3, further includes a p-type secondary sense amplifier 510 composed of two PMOS transistors P3 and P4, and an n-type secondary sense amplifier 520 composed of two NMOS transistors N3 and N4, respectively connected to the bit line pair BL and $\overline{BL}$.

The p-type secondary sense amplifier 510 receives the secondary power supply voltage Vccs as an operating voltage through a PMOS transistor P5, and the n-type secondary sense amplifier 520 receives the secondary ground potential Vsss as an operating voltage through an NMOS transistor N5. A gate of the PMOS transistor P5 is associated with a column selection signal CSL through an inverter I1, and a channel thereof coupled between the secondary power supply voltage Vccs and the p-type secondary sense amplifier 510 to thereby supply as an operating voltage the secondary power supply voltage Vccs to the p-type secondary sense amplifier 510 in accordance with a logic state of the column selection signal CSL. In the same manner a gate of the NOMS transistor N5 is associated with the column select ion signal CSL and a channel thereof is coupled between the secondary ground potential vsss and the n-type secondary sense amplifier 520 to thereby supply as an operating voltage the secondary ground potential Vsss to the n-type secondary sense amplified 520 under control of the column selection signal CSL.

Figure 4:
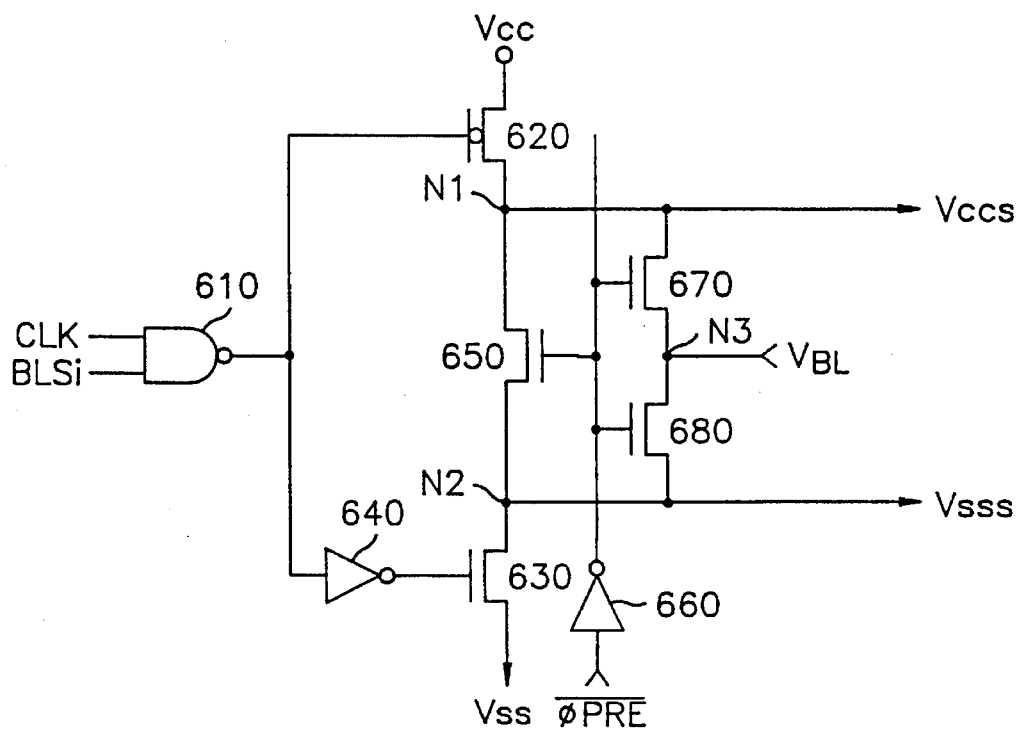
FIG. 4 is a circuit diagram illustrating a secondary power supply voltage generator constructed according to principles of the present invention.

FIG. 4 is a circuit diagram illustrating a secondary power supply voltage generator constructed according to the principles of the present invention, in which the secondary power supply voltage Vccs and the secondary ground potential Vsss are generated to supply In power supply voltages to the p-type secondary sense amplifier 510 and the n-type secondary sense amplifier 520, respectively. The secondary power supply voltage generating circuit includes a NAND gate 610, a PMOS transistor 620, an NMOS transistor 630, and a precharge circuit.

The NAND gate 610 receives a block selection signal BLSi for designating a memory block including a memory cell MC1 selected by a row address and an operation control signal CLK for controlling an operation of the secondary power supply voltage generating circuit and generates a corresponding logic result signal. The PMOS transistor 20 is connected to the output 610 at a gate thereof and its channel is coupled between the power supply voltage Vcc and the first node N1. The PMOS transistor 620 outputs the secondary power supply voltage Vccs, having substantially the same level as the power supply voltage, to a first node N1. The NMOS transistor 630 is connected to the output of the NAND gate 610 at a gate thereof through inverter 640 and is coupled between the second node N2 and the ground potential Vss at a channel thereof.

The NMOS transistor 630 outputs the secondary ground potential Vsss substantially having same level as the ground potential Vss to the second node N2. The precharge circuit is coupled between the first node N1 and the second and N2 aid equalizes potentials of the first node N1 and the second node N2. In response to a precharge signal $\overline{\Psi PRE}$, the circuit is precharged to a voltage $V_{BL}$ corresponding to an intermediate voltage level. The precharge circuit is comprised of a NMOS transistor 650, which is associated with the precharge signal $\overline{\Psi PRE}$ at a gate thereof through an inverter 660 and its channel is coupled between the first node N1 and the second node N2 NMOS transistors 670 and 680 are associated with the precharge signal $\overline{\Psi PRE}$ at gates thereof through a inverter 660 in common and their channels are connected in series between the first node N1 and the second node N2 Further, the precharge circuit applies as a precharge voltage the voltage $V_{BL}$ (which has the same level as an intermediate level of the bit line pair BL and $\overline{BL}$) corresponding to the intermediate level between the secondary power supply voltage Vccs and the secondary ground potential Vsss, to a third node N3 disposed at a channel connection point of NMOS transistors 670 and 680.

Figure 5:
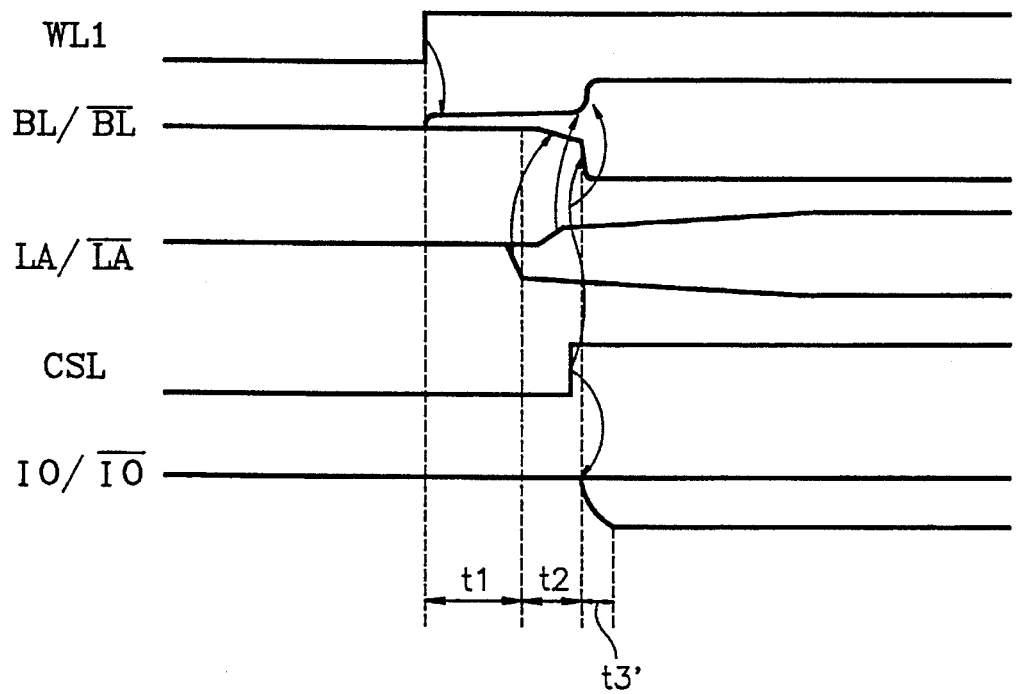
FIG. 5 is a timing diagram illustrating an operation of the bit line sense amplifier in FIG. 3.
Figure 6:
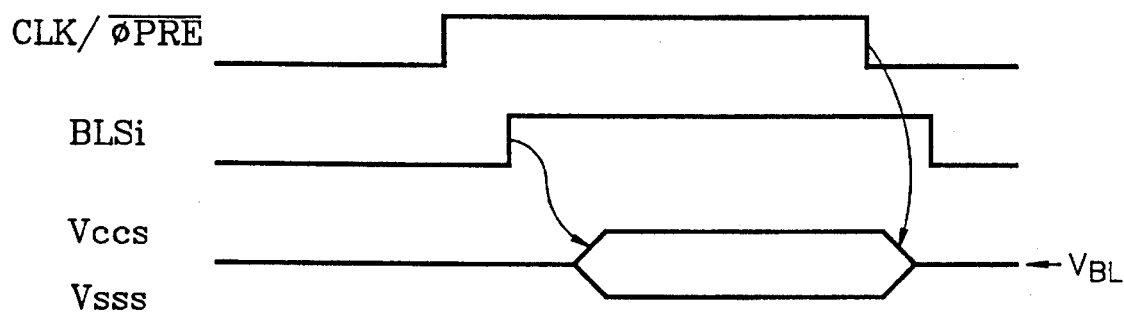
FIG. 6 is a timing diagram illustrating an operation of the secondary power supply voltage generator in FIG. 4.

FIGS. 5 and 6 respectively show timing diagrams illustrating operation of FIGS. 3 and 4. In FIGS. 5 and 6, assuming that a word line WL1 is selected by an input row address, an isolation control signal ISO1 goes to a logic "high" state and an isolation control signal ISO2 goes to a logic "low" stat. Thus, NMOS transistors 210 and 220 of the isolation circuit 200 are turned ON and NMOS transistors 310 and 320 of the isolation circuit 300 are turned OFF. Then, data stored in memory cell MC1 connected to the selected word line WL1 begins to share a charge with the bit line pair BL and $\overline{BL}$ precharged to a given level through the isolation circuit 200 during the period of time t1 of FIG. 5. Thereafter, when the sense amplifier driving signals LA and $\overline{LA}$ are respectively enabled to the logic "high" state and the logic "low" state, the p-type sense amplifier 110 and the n-type sense amplifier 120 sense a weak potential difference on the bit line and amplify the sensed potential difference during the period of time t2 of FIG. 5. It can be appreciated that the above operation is the same as that of the conventional circuit shown in FIG. 1.

However, if the column selection signal CSL is enabled to the logic "high" state during the sensing and amplifying operation of the bit line pair, NMOS trans 410 and 420 included in the transmission circuit 400 are turned ON so that the potential difference on the bit line BL and $\overline{BL}$ starts to perform a charge-sharing with the potential on the input/output line pair IO and $\overline{IO}$ precharged to a given level. At the same time, both PMGS transistor P5 and NMOS transistor N5 receiving the column selection signal CSL are turned ON to thereby respectively supply the secondary power supply voltage Vccs and the secondary ground potential Vsss to the p-type secondary sense amplifier 510 and the n-type secondary sense amplifier 520. In that case, the p-type and the n-type secondary sense amplifiers 510 and 520 speedily develop the respective potential difference between the bit line pair BL and $\overline{BL}$ and the input/output line pair IO and $\overline{IO}$ to levels of the secondary power supply voltage Vccs and the level of the secondary ground potential. Accordingly, as shown in FIG. 5, the bit line pair BL and $\overline{BL}$ and the input/output line pair IO and $\overline{IO}$ are developed in a steep state.

Figure 2:
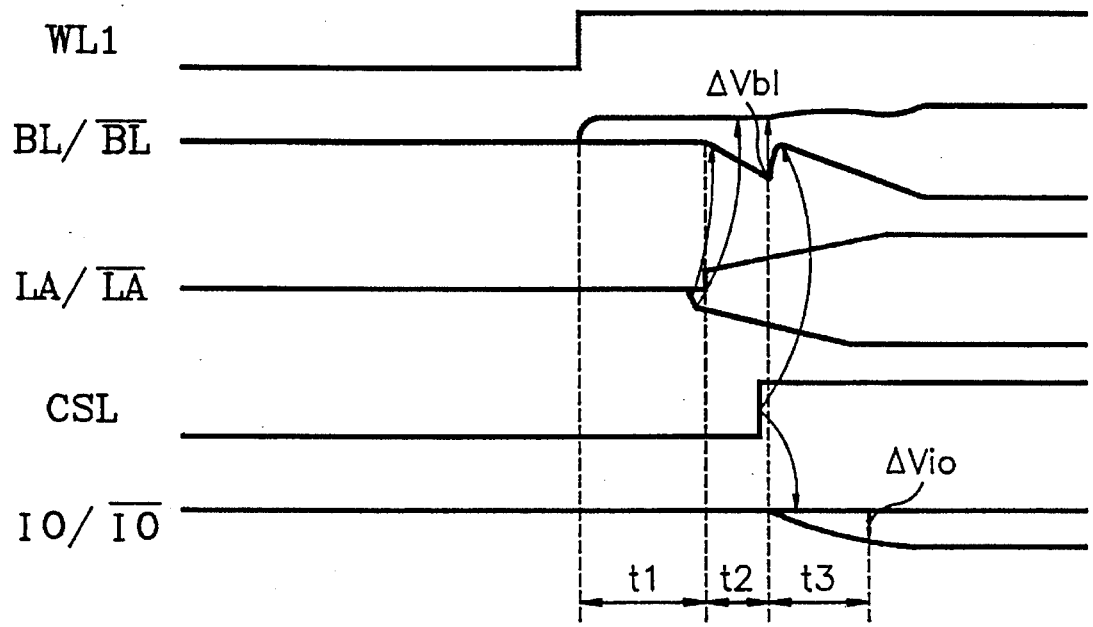
FIG. 2 is a timing diagram illustrating a data reading operation of the bit line sense amplifier of FIG. 1.

Besides, the conventional problem that the potential difference $\Delta VbL$ on the bit line pair BL and $\overline{BL}$ is abruptly reduced when the column selection signal is enabled can be eliminated. The p-type and n-type secondary sense amplifiers 510 and 520 are provided in each or bit line pairs, and have a strong current driving force due to the reception of the independent secondary power supply voltage. As a result, sufficient current can be supplied upon charge-sharing with the input/output line even though the parasitic capacitance of the input/output line is large. Thus, the problems of the conventional circuit FIG. 1, such as that the potential difference $\Delta VbL$ the bit line pair BL and $\overline{BL}$ is abruptly reduced upon charge-sharing between the bit line pair and the input/output line pair and that the developing speed of the input/output line pair IO and $\overline{IO}$ is delayed by the period of time t3 of FIG. 2, are removed. As a result, it can be noted that because the development slope of the Input/output line pair IO and $\overline{IO}$ is abruptly increased, the time required for developing potential difference of the input/output line pair is considerably shortened from the period of time t3 of FIG. 5.

The operation of the secondary power supply voltage generator according to the present invention will be described in detail with reference to FIGS. 4 and 6. The secondary power supply voltage generator is designed to be provided in each memory block and operated only when a corresponding memory block is selected by the block selection signal BLSi. For example, when the memory block connected to the secondary power supply voltage generator is selected, the block selection signal BLSi of the logic "high" state is supplied to the secondary power supply voltage generator, and then the operation control signal CLK is also enabled to the logic "high" state. And so, the NAND gate 610 receives the operation control signal CLK of the secondary power supply voltage of the logic "high" state and the block selection signal BLSi to thereby generate an output signal of the logic "low" state. The output signal in the "low" state is directly applied to the gate of the PMOS transistor 620 and through the inverter 640 to the gate of the NMOS transistor 630, so that both transistor 620 and transistor 630 are turned ON.

In this case, the precharge signal $\overline{\Psi PRE}$ is equal to the operation control signal CLK, which equalizes the first node N1 and the second node N2 when enabled to the logic "low" state, thereby precharging their voltages of to the voltage $V_{BL}$. Accordingly, since the precharge signal $\overline{\Psi PRE}$ has been disabled to the logic "high" state and gates of NMOS transistors 650, 670 and 680 are in the logic "low" states through the inverter 660, all of the transistors 650, 670 and 680 are turned OFF. Thus, the secondary power supply voltage Vccs, having substantially the same level as the power supply voltage Vcc, is outputted to the first node N1, and the secondary ground potential Vsss, having substantially the level as the ground potential Vss, is outputted to the second node N2.

On other hand, when the memory block connected to the secondary power supply voltage generator is unselected, both block selection signal BSLi and operation control signal CLK are disabled to the logic "low" slate and the precharge signal $\overline{\Psi PRE}$ is enabled to the logic "low" state. Accordingly, the output of the NAND gate 610 becomes in the logic "high" state, such that the PMOS transistor 620 and NMOS transistor 630 are turned OFF, and all of the transistors 650, 670 and 630 are turned ON. As a result, the voltages at the node N1 and node N2 are charged to the voltage $V_{BL}$ applied at the node N3. Thus, when the memory block is unselected, as shown in FIG. 6, the bit line pair of FIG. 3 is pre-charged with the voltage $V_{BL}$.

Figure 7:
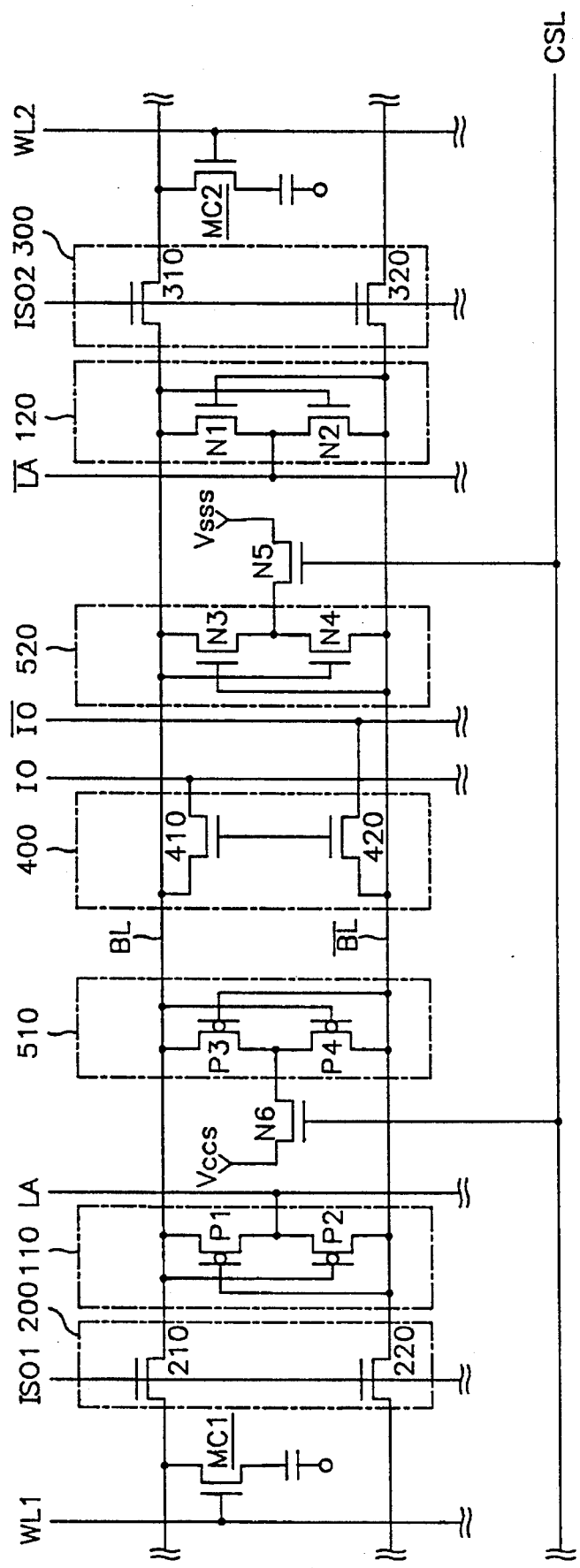
FIG. 7 is a circuit diagram illustrating a construction of the bit line sense amplifier according to another embodiment of the present invention.

FIG. 7 is a circuit diagram illustrating a configuration of a bit line sense amplifier according to another embodiment of the preset invention. In this embodiment, laying out the circuit is very convenient since the number of the elements can be reduced by replacing the PMOS transistor P5 and the inverter I1 by the NMOS transistor N6 that logically performs the corresponding operation thereto. However, the other configurations and operations are the same as those of the bit line sense amplifier shown in FIG. 3.

As described above, the bit line sense amplifier according to the present invention has an advantage in that the total operating speed is improved due to the speedy charge-sharing between the bit line pair having the slight potential difference and the input/output line pair having a relatively large parasitic capacitance, by supplying the secondary power supply voltage Vccs and the second ground potential Vsss to the respective p-type and n-type secondary sense amplifier in response to the column selection signal CSL.

While the invention has described with reference to a few specific embodiments the description is for illustrating the invention and should not to be construed as limiting the invention. Various modifications may occur to those skilled in the art without departing from the spirit and scope of the invention as defined by the appended claims.

What is claimed is:

1. A semiconductor memory device having at least one pair of bit lines, a plurality of memory cells, and transmission means for transmitting data of said bit line pair to a corresponding input/output line pair in response to a column selection signal, comprising:

a primary sense amplifier which senses and amplifies a logic state of data stored in a selected memory cell in response to a row address, and which outputs sense-amplified data to said bit line pair;

a secondary power supply voltage generating circuit which receives a primary power supply voltage and a primary ground potential and generates a secondary power supply voltage and a secondary ground potential in response to a first signal; and a secondary sense amplifier being supplied with said secondary power supply voltage and said secondary ground potential, which senses a potential difference of said sense-amplified data on said bit line pair and therefrom outputs levels of said secondary power supply voltage and said secondary ground potential on said bit line pair in response to said column selection signal.

2. The semiconductor memory device according to claim 1, wherein said first signal is a block selection signal for selecting a memory block including said selected memory cell.

3. The semiconductor memory device according to claim 1, wherein said secondary power supply voltage generating circuit includes a precharge circuit which equalizes and precharges an output voltage to a potential corresponding to an intermediate level of said secondary power supply voltage and said secondary ground potential and causes said secondary power supply voltage generating circuit to supply said output voltage as said secondary power supply voltage and said secondary ground potential in response to a precharge signal.

4. The semiconductor memory device according to claim 3, wherein said precharge signal is activated when said first signal is not activated.

5. The semiconductor memory device according to claim 3, wherein said secondary power supply voltage generating circuit includes:

a logic signal generator which outputs a given logic signal in response to said first signal and a control signal for controlling an operation of said secondary power supply voltage generating circuit;

a secondary power supply voltage generator which provides said secondary power supply voltage in response to said given logic signal output from said logic signal generator; and a secondary ground potential generator which provides said secondary ground potential in response to said given logic signal output from said logic signal generator.

6. The semiconductor memory device according to claim 5, wherein said secondary power supply voltage has substantially the same level as said power supply voltage.

7. The semiconductor memory device according to claim 5, wherein said secondary ground potential has substantially the same level as said ground potential.

8. The semiconductor memory device according to claim 1, wherein said secondary sense amplifier includes:

a first secondary sense amplifier being supplied with said secondary power supply voltage, which senses said potential difference on said bit line pair and outputs a level of said secondary power supply voltage on a first bit line of said bit line pair in response to said column selection signal; and a second secondary sense amplifier being supplied with said secondary ground potential, which senses said potential difference on said bit line pair and outputs a level of said secondary ground potential on a second bit line of said bit line pair in response to said column selection signal.

9. The semiconductor memory device according to claim 8, wherein said second secondary sense amplifier includes a pair of NMOS transistors having a driving capacity sufficient to overcome a parasitic capacitance of said input/output line pair.

10. The semiconductor memory device according to claim 8, wherein said first secondary sense amplifier includes a pair of PMOS transistors having a driving capacity sufficient to overcome a parasitic capacitance of said input/output line pair.

11. The semiconductor memory device according to claim 10, wherein said second secondary sense amplifier includes a pair of NMOS transistors having a driving capacity sufficient to overcome a parasitic capacitance of said input/output line pair.

12. The semiconductor memory device according to claim 11, wherein said primary sense amplifier includes:

a first primary sense amplifier having a pair of PMOS transistors cross-coupled to said bit line pair; and a second primary sense amplifier having a pair of NMOS transistors cross-coupled to said bit line pair.

* * * * *